(12) United States Patent
Sfez et al.

(10) Patent No.: US 11,982,836 B2
(45) Date of Patent: May 14, 2024

(54) HEATING ATOM-VAPOR CELL USING AN OPTICAL FIBER

(71) Applicant: Soreq Nuclear Research Center, Yavne (IL)

(72) Inventors: Bruno Sfez, Yavne (IL); Yoav Sintov, Yavne (IL); Shaul Pearl, Yavne (IL)

(73) Assignee: Soreq Nuclear Research Center, Yavne (IL)

( * ) Notice: Subject to any disclaimer, the term of this patent is extended or adjusted under 35 U.S.C. 154(b) by 0 days.

(21) Appl. No.: 17/906,075

(22) PCT Filed: Mar. 23, 2021

(86) PCT No.: PCT/IB2021/052394
§ 371 (c)(1),
(2) Date: Sep. 12, 2022

(87) PCT Pub. No.: WO2021/198846
PCT Pub. Date: Oct. 7, 2021

(65) Prior Publication Data
US 2023/0119397 A1    Apr. 20, 2023

Related U.S. Application Data

(60) Provisional application No. 63/001,356, filed on Mar. 29, 2020.

(51) Int. Cl.
*G02B 6/036* (2006.01)
*G02B 6/02* (2006.01)

(52) U.S. Cl.
CPC ..... *G02B 6/02395* (2013.01); *G02B 6/02038* (2013.01); *G02B 6/03694* (2013.01)

(58) Field of Classification Search
None
See application file for complete search history.

(56) References Cited

U.S. PATENT DOCUMENTS

| 11,614,464 B2* | 3/2023 | Ma | G01N 21/01 850/33 |
| 2015/0057648 A1* | 2/2015 | Swift | A61B 18/245 606/15 |
| 2020/0057116 A1 | 2/2020 | Zorzos | |

FOREIGN PATENT DOCUMENTS

WO    WO-2015115637 A1 *    8/2015    ............. G02B 6/245

OTHER PUBLICATIONS

International Search Report and Written Opinion, PCT/IB2021/052394, mailed Jun. 25, 2021.
Jan Preusser et al: "A microfabricated photonic magnetometer", Frequency Control Symposium, 2009 Joint With the 22nd European Frequency and Time Forum. IEEE International, IEEE, Piscataway, NJ, USA, Apr. 20, 2009 (Apr. 20, 2009), pp. 1180-1182, XP031492582, ISBN: 978-1-4244-3511-1.

* cited by examiner

*Primary Examiner* — Chris H Chu
(74) *Attorney, Agent, or Firm* — Dekel Patent Ltd.; David Klein

(57) ABSTRACT

An optical fiber heating device includes a heat producing fiber wrapped around a cell which is filled with an atom vapor.

9 Claims, 1 Drawing Sheet

HEATING ATOM-VAPOR CELL USING AN OPTICAL FIBER

FIELD OF THE INVENTION

The present invention relates to a method and device for heating cells filled with atom vapor, and particularly to a method and device for heating such cells with an optical fiber.

BACKGROUND OF THE INVENTION

Compact glass cells filled with an alkali atom vapor and buffer gas are used in different applications, such as miniaturized atomic clocks and magnetometers. The cells may contain vapors of specific atomic elements or molecular compounds, each of which has a well-defined absorption spectrum.

In many applications, there is a need to heat and control the temperature of glass cells containing atom vapors for different quantum devices. In some cases, metallic parts as well as electric currents must be excluded from the heating process which presents technological challenges how to achieve the requisite heating.

SUMMARY OF THE INVENTION

The present invention seeks to provide an all-optical solution for heating a cell filled with atom vapor, as is described more in detail hereinbelow. The solution is based on guiding light in an optical fiber and converting the light into heat. The invention includes wrapping the cell with a heat producing optical fiber, as is described more in detail hereinbelow.

There is provided in accordance with a non-limiting embodiment of the invention an optical fiber heating device including a heat producing optical fiber wrapped around a cell which is filled with an atom vapor.

In accordance with a non-limiting embodiment of the invention the fiber includes a central core, an inner clad and an outer clad that encircles the inner clad and forms an optical waveguide, wherein light propagates in the inner clad of the fiber.

In accordance with a non-limiting embodiment of the invention the core or a layer encircling the core located in the inner clad, is doped with an absorbing dopant, such that a light beam propagating in the inner clad overlaps the core or the layer and is absorbed by the core or the layer and thereby produces heat.

In accordance with a non-limiting embodiment of the invention the inner clad is larger than the core.

In accordance with a non-limiting embodiment of the invention the outer clad has a lower refractive index than the inner clad.

In accordance with a non-limiting embodiment of the invention the outer clad includes an absorbing polymeric or glass coating and the inner clad may include a core (alternatively it is a coreless fiber with an inner clad and an outer absorbing clad).

In accordance with a non-limiting embodiment of the invention the fiber is wrapped around a heat conductive coating located on the cell.

In accordance with a non-limiting embodiment of the invention the fiber is embedded in a heat conductive polymeric material.

In accordance with a non-limiting embodiment of the invention the fiber is covered by a heat reflector.

In accordance with a non-limiting embodiment of the invention the fiber is coated with a polymer jacket.

BRIEF DESCRIPTION OF THE DRAWINGS

The present invention will be understood and appreciated more fully from the following detailed description, taken in conjunction with the drawings in which.

DETAILED DESCRIPTION OF THE INVENTION

Figure 1:
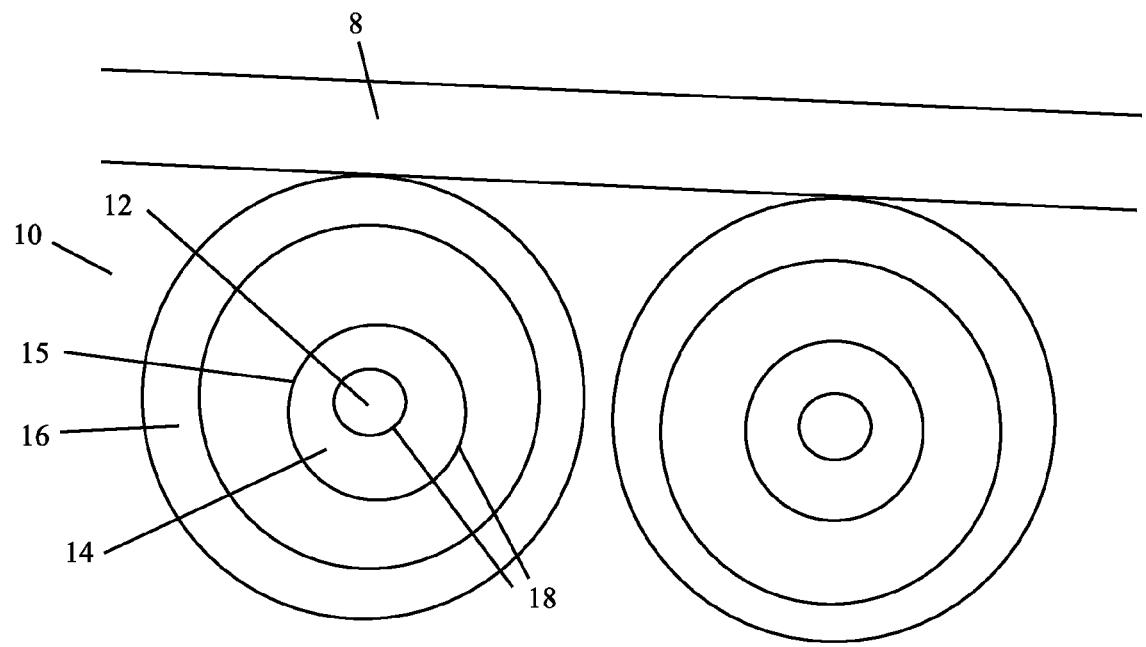
FIG. 1 is a simplified illustration of an optical fiber heating device for heating a cell, in accordance with a non-limiting embodiment of the invention.

Reference is now made to FIG. 1, which illustrates an optical fiber heating device 10 for heating a cell, in accordance with a non-limiting embodiment of the invention. The device 10 includes a heat producing fiber which is wrapped around a cell 8 filled with atom vapor.

In one embodiment, the optical fiber heating device 10 includes a central core 12, an inner clad 14 and an outer clad 16 that encircles the inner clad 14 and forms an optical waveguide. Light propagates in the inner clad 14. The fiber core 12, or a layer 15 encircling the core 12 located in the inner clad 14, is doped with an absorbing dopant 18, such that a light beam propagating in the inner clad 14 overlaps and is absorbed by either the core 12 or layer 15 and produces heat.

Light is coupled into the inner clad 14, as opposed to the usual way of being coupled into the core 12. The inner clad 14 is much larger than the core 12, which strongly reduces the requirements regarding the light source brightness. For example a low cost diode can be used as a light source. Light is then absorbed along the fiber's doped core 12 or doped layer 15 in a longitudinally homogeneous manner, generating distributed heat. Control of the dopant concentration and/or the propagating light wavelength can be used to modify the heat generation distribution along the cell 8.

Figure 2:
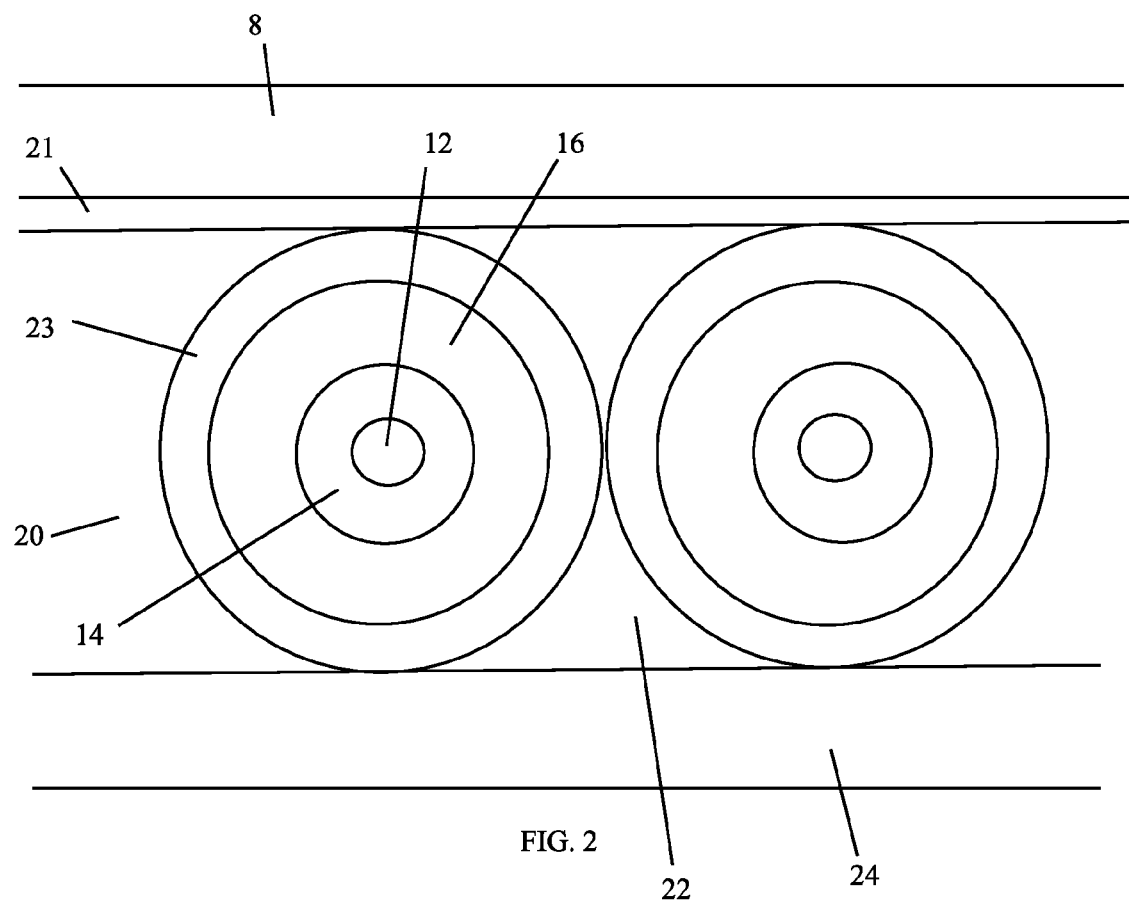
FIG. 2 is a simplified illustration of an optical fiber heating device for heating a cell, in accordance with another non-limiting embodiment of the invention.

Reference is now made to FIG. 2, which illustrates an optical fiber heating device 20 for heating a cell, in accordance with another non-limiting embodiment of the invention. Device 20 is similar to device 10, and like elements are designated by like numerals.

In this embodiment, the outer clad 16 of the optical fiber heating device 10 has a lower refractive index than the inner clad 14. The outer clad 16 may be formed by an absorbing material (for example, but not limited to, a polymer coating filled with carbon black or carbon nanotubes). Light propagating in the inner clad 14 partially overlaps with the outer clad 16 and is thereby absorbed and produces heat. For example, the fiber can be made of a standard single mode optical fiber for the inner clad 14 and an absorbing polymeric coating for the outer clad 16.

The outer clad 16 is designed in such a way that its refractive index is slightly lower than the refractive index of the inner clad 14. Light is coupled into the inner clad 14 (and not the core, as usual), which is done by, but not limited to, a low cost diode coupling as explained above. Since the outer clad 16 has a lower refractive index, light is guided in the inner clad 14 and is gradually absorbed in the outer clad 16, where it is transformed to heat. The light transfer can be controlled by modifying the outer clad refractive index and/or the absorbing agent concentration and/or the light source wavelength in case the absorption of the absorbing material is wavelength selective.

The fiber in the embodiment of FIG. 2 is wrapped around the cell 8; optionally there may be a heat conductive coating 21 on the cell wall. The fibers may be embedded in a heat conductive polymeric material 22. The fibers may be covered by a heat reflector 24 for improved thermal insulation. The fibers may be coated with a polymer jacket 23. Heating distribution may be modified by modifying the wrapping density, the thermal properties of the heat conductive coating 21 on the cell walls (or of polymer jacket 23 or heat reflector 24) and/or adjusting the light source wavelength.

What is claimed is:

1. An optical fiber heating device comprising:
   a heat producing optical fiber wrapped around a cell filled with an atom vapor, wherein said fiber comprises a core, an inner clad and an outer clad that encircles said inner clad and forms an optical waveguide, wherein light propagates in said inner clad, and wherein said core, or a layer encircling said core located in said inner clad, is doped with an absorbing dopant, such that a light beam propagating in said inner clad overlaps and is absorbed by said core or said layer and produces heat.

2. The optical fiber heating device according to claim 1, wherein said inner clad is larger than said core.

3. The optical fiber heating device according to claim 1, wherein said outer clad has a lower refractive index than said inner clad.

4. The optical fiber heating device according to claim 1, wherein said outer clad comprises an absorbing polymeric coating.

5. The optical fiber heating device according to claim 1, wherein said fiber is wrapped around a heat conductive coating located on said cell.

6. The optical fiber heating device according to claim 1, wherein said fiber is embedded in a heat conductive polymeric material.

7. The optical fiber heating device according to claim 1, wherein said fiber is covered by a heat reflector.

8. The optical fiber heating device according to claim 1, wherein said fiber is coated with a polymer jacket.

9. The optical fiber heating device according to claim 1, wherein a wrapping density of wrappings of said fiber is changeable.

* * * * *